(12) United States Patent
Han (10) Patent No.: US 10,304,994 B2
(45) Date of Patent: May 28, 2019

(54) ORGANIC LIGHT EMITTING DISPLAY PANEL

(71) Applicant: Shenzhen China Star Optoelectronics Technology Co., Ltd., Shenzhen, Guangdong (CN)

(72) Inventor: Baixiang Han, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/533,646

(22) PCT Filed: May 19, 2017

(86) PCT No.: PCT/CN2017/085080
§ 371 (c)(1),
(2) Date: Jun. 6, 2017

(87) PCT Pub. No.: WO2018/188162
PCT Pub. Date: Oct. 18, 2018

(65) Prior Publication Data
US 2018/0294322 A1    Oct. 11, 2018

(30) Foreign Application Priority Data
Apr. 10, 2017   (CN) .......................... 2017 1 0229985

(51) Int. Cl.
*H01L 33/00* (2010.01)
*H01L 21/00* (2006.01)
(Continued)

(52) U.S. Cl.
CPC ........ *H01L 33/145* (2013.01); *H01L 27/3246* (2013.01); *H01L 27/3272* (2013.01)

(58) Field of Classification Search
CPC ..................................................... H01L 33/145
(Continued)

(56) References Cited

U.S. PATENT DOCUMENTS 8,400,589 B2 *  3/2013  Lee ................... G02F 1/136209
                                                    349/110
2004/0221806 A1   11/2004  Kim
(Continued)

FOREIGN PATENT DOCUMENTS

CN          101290905 A         10/2008
CN          101771070 A          7/2010
(Continued)

*Primary Examiner* — Calvin Lee
(74) *Attorney, Agent, or Firm* — Andrew C. Cheng (57) ABSTRACT

The present invention discloses an organic light emitting display panel. Wherein the organic light emitting display panel comprises: a substrate; a plurality of anode electrodes; a pixel defining layer for defining an effective light emitting area and a non-effective light emitting area; a blocking pattern is arranged on the pixel defining layer; an organic light emitting layer is arranged on the anode electrode, the blocking pattern, and the pixel defining layer; a cathode layer is arranged on the organic light emitting layer, wherein the blocking pattern separates the organic light emitting layer and the cathode layer in the effective light emitting area, and the organic light emitting layer and the cathode layer in the none-effective light emitting area. By the above-mentioned description, the present invention can reduce light leakage caused by lateral conduction of the organic light emitting layer, thereby display quality of the panel can be improved.

20 Claims, 5 Drawing Sheets

(51) Int. Cl.
  *H01L 33/14* (2010.01)
  *H01L 27/32* (2006.01)
(58) Field of Classification Search
  USPC .............................................. 438/29; 257/98
  See application file for complete search history.

(56) References Cited

U.S. PATENT DOCUMENTS

| | | |
|---|---|---|
| 2014/0042417 A1 | 2/2014 | Okumoto et al. |
| 2014/0312329 A1 | 10/2014 | Fujii et al. |
| 2014/0319481 A1 | 10/2014 | Lee et al. |
| 2015/0001486 A1 | 1/2015 | Kim et al. |
| 2015/0380467 A1 | 12/2015 | Su |
| 2016/0248035 A1* | 8/2016 | Hwang ............... H01L 27/3246 |

FOREIGN PATENT DOCUMENTS

| | | |
|---|---|---|
| CN | 103022375 A | 4/2013 |
| CN | 204809228 U | 11/2015 |

* cited by examiner

ORGANIC LIGHT EMITTING DISPLAY PANEL

FIELD OF THE INVENTION

The present invention relates to a technology of display manufacturing, and more particularly, to an array substrate and an organic light emitting display panel.

DESCRIPTION OF PRIOR ART

Organic light emitting diode (OLED), because of its self-luminous, fast response, wide viewing angle and other characteristics, OLED-based organic light emitting display to become the mainstream products in display field.

Wherein, when the production process of the light emitting layer is for the whole surface deposition, because of the material life and other factors, the light emitting layer will have a possibility of lateral conduction, and the light reflected to the panel is called light leakage, and thus the display quality of panel is reduced.

SUMMARY OF THE INVENTION

The technical problem solved by the present invention mainly is to provide an organic light emitting display panel, which can reduce light leakage caused by lateral conduction of the organic light emitting layer, thereby display quality of the panel can be improved.

In order to solve the above-mentioned technical problem, a technical solution adopted by the present invention is to provide an organic light emitting display panel, wherein comprises: a substrate; a plurality of anode electrodes is arranged on the substrate in an array manner; a pixel defining layer is arranged on the substrate and at least exposes partially the anode electrode, thereby an effective light emitting area corresponding to each of the anode electrode and a non-effective light emitting area located around the effective light emitting area are defined; a blocking pattern is arranged on the pixel defining layer and at least surrounds partially the effective light emitting area, wherein the cross-section of the blocking pattern perpendicular to the substrate is arranged in an inverted trapezoidal shape, the length of upper base of the trapezoidal shape far to the substrate is larger than the length of lower base of the trapezoidal shape near to the substrate, and the angle between the lower base and leg of inverted trapezoidal shape is an obtuse angle; an organic light emitting layer is arranged on the anode electrode, the blocking pattern, and the pixel defining layer; a cathode layer is arranged on the organic light emitting layer, wherein the blocking pattern separates the organic light emitting layer and the cathode layer in the effective light emitting area and the organic light emitting layer and the cathode layer in the none-effective light emitting area, and wherein the organic light emitting layer and the cathode layer are arranged wholly on the substrate.

In order to solve the above-mentioned technical problem, a technical solution adopted by the present invention is to provide an organic light emitting display panel, wherein comprises: a substrate; a plurality of anode electrodes is arranged on the substrate in an array manner; a pixel defining layer is arranged on the substrate and at least exposing partially the anode electrode, thereby an effective light emitting area corresponding to each of the anode electrode and a non-effective light emitting area located around the effective light emitting area are defined; a blocking pattern is arranged on the pixel defining layer and at least surrounding partially the effective light emitting area; an organic light emitting layer is arranged on the anode electrode, the blocking pattern, and the pixel defining layer; a cathode layer is arranged on the organic light emitting layer, wherein the blocking pattern separates the organic light emitting layer and the cathode layer in the effective light emitting area, and the organic light emitting layer and the cathode layer in the none-effective light emitting area.

In order to solve the above-mentioned technical problem, a technical solution adopted by the present invention is to provide a display device, which comprises: a substrate; a plurality of anode electrodes is arranged on the substrate in an array manner; a pixel defining layer is arranged on the substrate and at least exposing partially the anode electrode, thereby an effective light emitting area corresponding to each of the anode electrode and a non-effective light emitting area located around the effective light emitting area are defined; a blocking pattern is arranged on the pixel defining layer and at least surrounding partially the effective light emitting area; an organic light emitting layer is arranged on the anode electrode, the blocking pattern, and the pixel defining layer; a cathode layer is arranged on the organic light emitting layer, wherein the blocking pattern separates the organic light emitting layer and the cathode layer in the effective light emitting area, and the organic light emitting layer and the cathode layer in the none-effective light emitting area; a driving circuit is arranged on the substrate.

The present invention can be concluded with the following advantages, the organic light emitting display panel provided by the present invention is different from the prior art of comprising a substrate, a plurality of anode electrodes, a pixel defining layer, a blocking pattern, an organic light emitting layer, and a cathode layer, wherein the blocking pattern separates the organic light emitting layer and the cathode layer in the effective light emitting area, and the organic light emitting layer and the cathode layer in the none-effective light emitting area, it is possible to suppress the lateral conduction path of the organic light emitting layer, thereby display quality of the panel can be improved.

DESCRIPTION OF PREFERRED EMBODIMENT

Technical implementation will be described below clearly and fully by combining with drawings made in accordance with an embodiment in the present invention.

Figure 1:
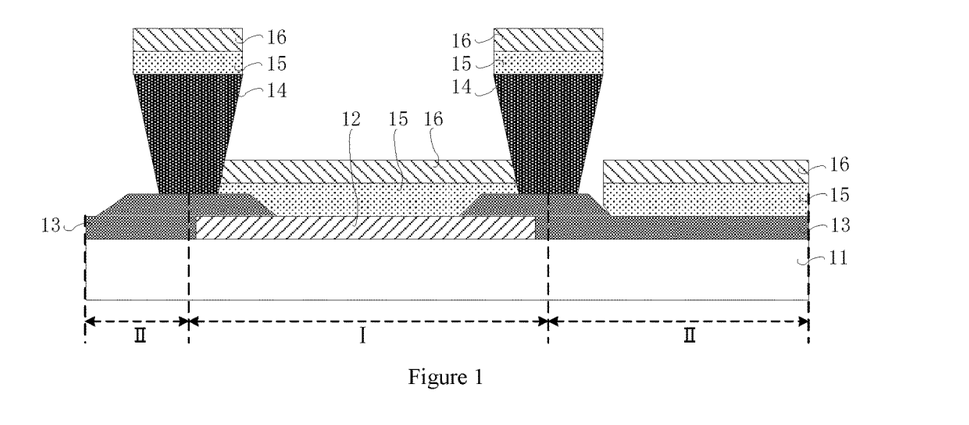
FIG. 1 is a structural illustration of the first embodiment made in accordance to an organic light emitting display panel in the present invention.

Referring to FIG. 1, FIG. 1 is a structural illustration of the first embodiment made in accordance to an organic light emitting display panel in the present invention. As shown in FIG. 1, the organic light emitting display panel 10 of the present embodiment comprises: a substrate 11, anode electrodes 12, a pixel defining layer 13, a blocking pattern 14, an organic light emitting layer 15, and a cathode layer 16. Wherein the organic light emitting display panel 10 is divided into an effective light emitting area I and a non-effective light emitting area II, the effective light emitting area I corresponding to the anode electrode 12, and the non-effective light emitting area II is located around the effective light emitting area. Specifically, a plurality of anode electrodes 12 is arranged on the substrate 11 in an array manner; a pixel defining layer 13 is arranged on the substrate 11 and at least exposes partially the anode electrode 12, thereby an effective light emitting area I corresponding to each of the anode electrode 12 and a non-effective light emitting area II located around the effective light emitting area are defined; a blocking pattern 14 is arranged on the pixel defining layer 13 and at least surrounds partially the effective light emitting area I; an organic light emitting layer 15 is arranged on the anode electrode 12, the blocking pattern 14, and the pixel defining layer 13; a cathode layer 16 is arranged on the organic light emitting layer 15, wherein the blocking pattern 14 separates the organic light emitting layer 15 and the cathode layer 16 in the effective light emitting area I, and the organic light emitting layer 15 and the cathode layer 16 in the none-effective light emitting area II.

Figure 2:
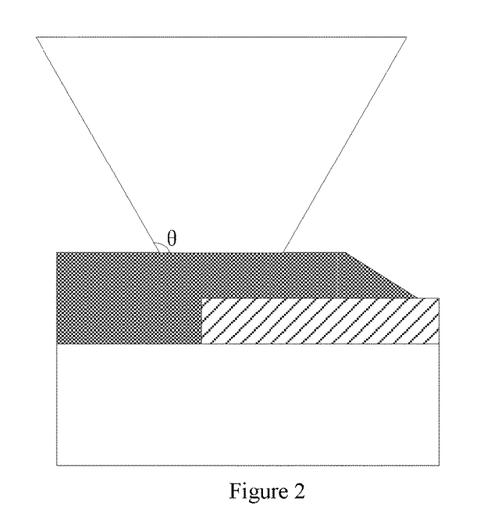
FIG. 2 is a structural illustration of the second embodiment made in accordance to an organic light emitting display panel in the present invention.

Preferably, the anode electrode 12 is made of a transparent or translucent conductor. The specific material can be indium tin oxide (ITO) conductive glass, indium tin oxide film is the main component of indium tin oxide. In the case of a thickness of only a few thousand angstroms, transmission rate of indium oxide is high, and conductivity of tin oxide is strong.

Wherein the cross-section of the blocking pattern 14 perpendicular to the substrate 11 is arranged in an inverted trapezoidal shape, as shown in FIG. 2, the length of upper base of the trapezoidal shape far to the substrate is larger than the length of lower base of the trapezoidal shape near to the substrate, and the angle between the lower base and leg of inverted trapezoidal shape is an obtuse angle, e.g., θ is an obtuse angle.

Specifically, the θ is not less than 120 degrees and not more than 150 degrees, further, the θ is 135 degrees.

Further, the blocking pattern 14 is arranged such that the organic light emitting layer 15 and the cathode layer 16 in the effective light emitting area I and the organic light emitting layer 15 and the cathode layer 16 on the blocking pattern are separated from each other, and the organic light emitting layer 15 and the cathode layer 16 on the blocking pattern 14 and the organic light emitting layer 15 and the cathode layer 16 in the non-effective light emitting area II are separated from each other.

Specifically, because the effect of the blocking pattern 14 is that when the organic light emitting layer 15 and the cathode layer 16 are arranged wholly on the substrate 11, the organic light emitting layer 15 and the cathode layer 16 of the effective light emitting area I and the non-effective light emitting area II can be separated. Thus, the blocking pattern 14 perpendicular to the substrate 11 may also be other patterns such as a hexagon, an octagon, an elliptical runway, and so on.

Figure 3:
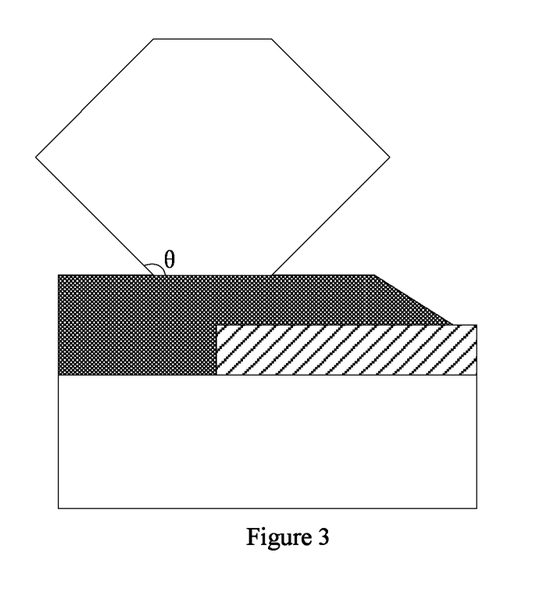
FIG. 3 is a structural illustration of the third embodiment made in accordance to an organic light emitting display panel in the present invention.

Specifically, as shown in FIG. 3, the blocking pattern 14 perpendicular to the substrate 11 is a hexagon, the hexagon may be a regular hexagon, e.g., internal angle of the hexagon is 120 degrees.

Figure 4:
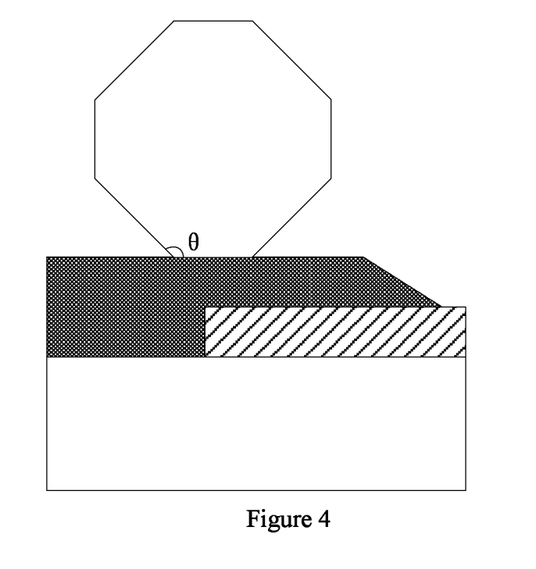
FIG. 4 is a structural illustration of the forth embodiment made in accordance to an organic light emitting display panel in the present invention.

Specifically, as shown in FIG. 4, the blocking pattern 14 perpendicular to the substrate 11 is an octagon, the octagon may be a regular octagon, e.g., internal angle of the hexagon is 135 degrees.

Figure 5:
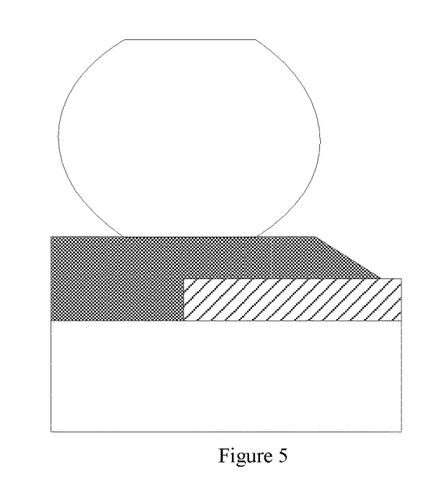
FIG. 5 is a structural illustration of the fifth embodiment made in accordance to an organic light emitting display panel in the present invention.

Specifically, as shown in FIG. 5, the blocking pattern 14 perpendicular to the substrate 11 is an elliptical runway, one of the straight edges of the elliptical runway is arranged on the substrate and its length can be set by user. Moreover, the curvature and length of the two arcs of the elliptical runway can also be set by the user.

Figure 6:
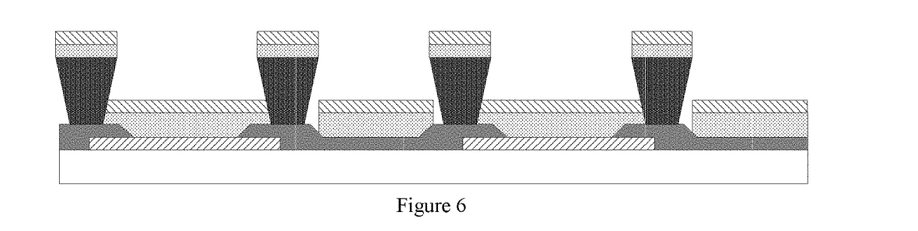
FIG. 6 is a structural illustration of the sixth embodiment made in accordance to an organic light emitting display panel in the present invention.

Further, in the present embodiment, the organic light emitting layer 15 and the cathode layer 16 are arranged wholly on the substrate 11. As shown in FIG. 6, FIG. 6 is a structural illustration of the sixth embodiment made in accordance to an organic light emitting display panel in the present invention. Wherein the pixel defining layer 13 covers the edge of the anode electrode 12, and the blocking pattern 14 is at least arranged partially on the area that the pixel defining layer 13 covers the anode electrode 12. Specifically, the organic light emitting display panel in which the organic light emitting layer is in the form of continuous coating can suppress the light leakage by the structure in the present embodiment. Specifically, the organic luminescent layer can be a white light with RGB color film, or a blue light whit RGB color film.

Wherein the blocking pattern 14 surrounds the effective light emitting area I and an opening area is arranged, and the organic light emitting layer 15 and the cathode layer 16 in the effective light emitting area I are electrically connected to the organic light emitting layer 15 and the cathode layer 16 in the non-effective light emitting area II via the opening area.

Further, the effective light emitting area I is arranged in a rectangular shape, and the blocking pattern 14 surrounds three of the four sides of the effective light emitting area I, the opening area is arranged on the rest side of the effective light emitting area I.

Figure 7:
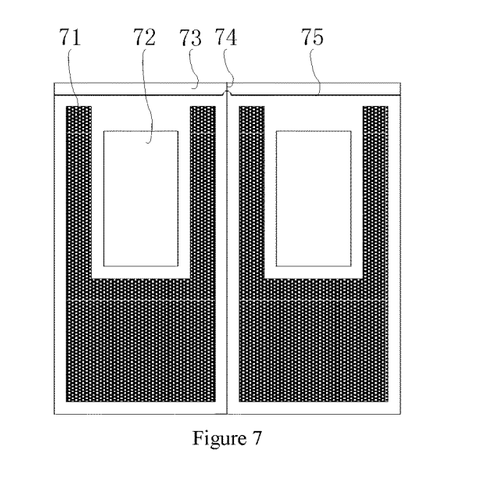
FIG. 7 is a structural illustration of the seventh embodiment made in accordance to an organic light emitting display panel in the present invention.

Specifically, as shown in FIG. 7, FIG. 7 is a structural illustration of the seventh embodiment made in accordance to an organic light emitting display panel in the present invention. The anode electrode light transmission area of FIG. 7 corresponds to FIG. 6, and FIG. 7 corresponds to the pixel structure diagram of FIG. 1, wherein the area 71 represents the area covered by the blocking pattern 14 in FIG. 1, the area 72 represents the effective light emitting area I in FIG. 1, the area 73 represents the non-effective light emitting area II in FIG. 1, the column line 74 is a source data line, and the horizontal line 75 is a gate scan line. Wherein the opening area arranged directly above the area 72 is a lead-in area of the cathode electrode. In addition, the area 73 corresponds to the gate and source wiring areas, and even if the light leakage can be blocked.

Figure 8:
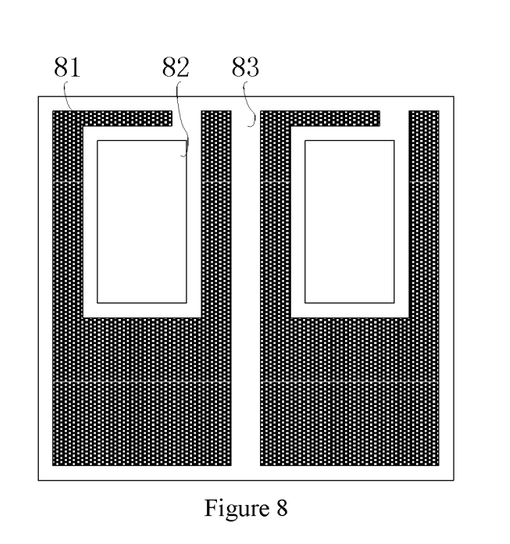
FIG. 8 is a structural illustration of the eighth embodiment made in accordance to an organic light emitting display panel in the present invention.

Preferably, as shown in FIG. 8, FIG. 8 is a structural illustration of the eighth embodiment made in accordance to an organic light emitting display panel in the present invention. The anode electrode light transmission area of FIG. 8 corresponds to FIG. 6, and FIG. 8 corresponds to the pixel structure diagram of FIG. 1, wherein the area 81 represents the area covered by the blocking pattern 14 in FIG. 1, the area 82 represents the effective light emitting area I in FIG. 1, the area 83 represents the non-effective light emitting area II in FIG. 1. Wherein the opening area arranged at the upper right of the area 82 is the lead-in area of the cathode electrode, the size of the opening area set for the upper right of the area 82 can be set by the user.

Figure 9:
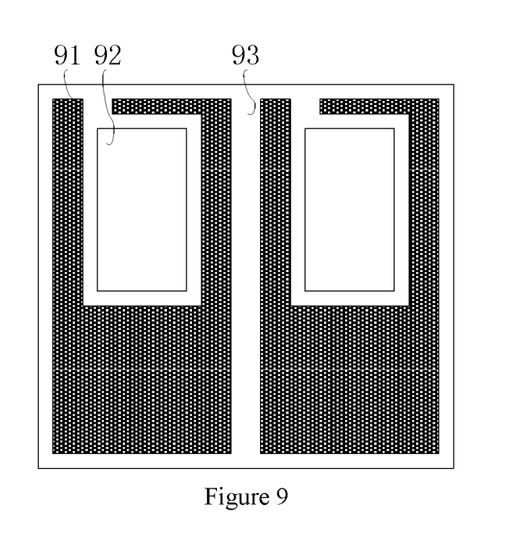
FIG. 9 is a structural illustration of the ninth embodiment made in accordance to an organic light emitting display panel in the present invention.

Preferably, as shown in FIG. 9, FIG. 9 is a structural illustration of the ninth embodiment made in accordance to an organic light emitting display panel in the present invention. The anode electrode light transmission area of FIG. 9 corresponds to FIG. 6, and FIG. 9 corresponds to the pixel structure diagram of FIG. 1, wherein the area 91 represents the area covered by the blocking pattern 14 in FIG. 1, the area 92 represents the effective light emitting area I in FIG. 1, the area 93 represents the non-effective light emitting area II in FIG. 1. Wherein the opening area arranged at the upper right of the area 92 is the lead-in area of the cathode electrode, the size of the opening area set for the upper right of the area 92 can be set by the user.

Figure 10:
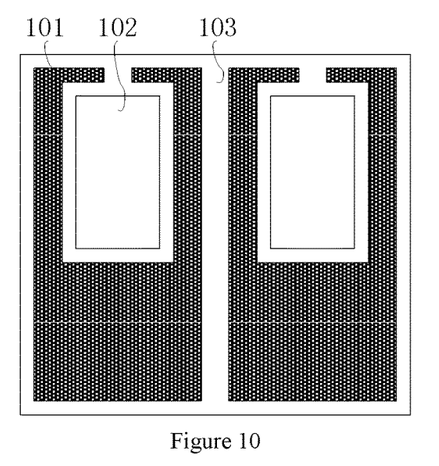
FIG. 10 is a structural illustration of the tenth embodiment made in accordance to an organic light emitting display panel in the present invention.

Preferably, as shown in FIG. 10, FIG. 10 is a structural illustration of the tenth embodiment made in accordance to an organic light emitting display panel in the present invention. The anode electrode light transmission area of FIG. 10 corresponds to FIG. 6, and FIG. 10 corresponds to the pixel structure diagram of FIG. 1, wherein the area 101 represents the area covered by the blocking pattern 14 in FIG. 1, the area 102 represents the effective light emitting area I in FIG. 1, the area 103 represents the non-effective light emitting area II in FIG. 1. Wherein the opening area arranged at the upper right of the area 102 is the lead-in area of the cathode electrode, the size of the opening area set for the upper right of the area 102 can be set by the user.

Specifically, the pixel defining layer 13 is an inorganic material, and the blocking pattern 14 is an organic material.

In the present embodiment, the organic light emitting display panel comprises a substrate, a plurality of anode electrodes, a pixel defining layer, a blocking pattern, an organic light emitting layer, and a cathode layer, wherein the blocking pattern separates the organic light emitting layer and the cathode layer in the effective light emitting area, and the organic light emitting layer and the cathode layer in the none-effective light emitting area, it is possible to suppress the lateral conduction path of the organic light emitting layer, thereby display quality of the panel can be improved.

Figure 11:
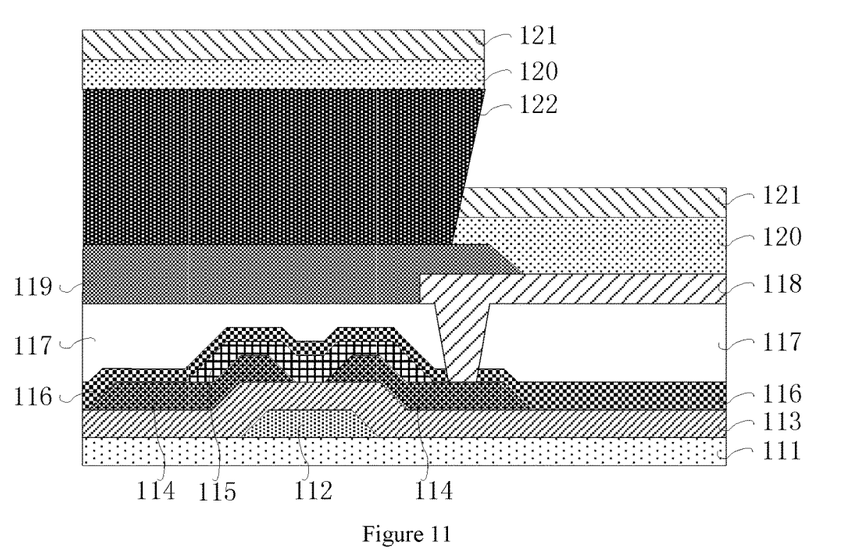
FIG. 11 is a structural illustration of the eleventh embodiment made in accordance to an organic light emitting display panel in the present invention.

Referring to FIG. 11, FIG. 11 is a structural illustration of the eleventh embodiment made in accordance to an organic light emitting display panel in the present invention. The organic light emitting display panel 110 comprises a substrate 111, a gate 112, a gate protection layer 113, a source/drain 114, a channel layer 115, an inorganic material protection layer 116, an organic material protection layer 117, an anode electrode layer 118, a pixel defining layer 119, an organic light emitting layer 120, a cathode electrode layer 121, and a blocking pattern 122.

Wherein the blocking pattern 122 is arranged on the driving circuit.

Further, the data line 112 and the scanning line 114 are at least overlapped partially by the organic light emitting layer 120 and the cathode layer 121 in the non-effective light emitting area.

Specifically, the material of the channel layer 115 is indium gallium zinc oxide (IGZO.)

Specifically, the material of the anode electrode layer 118 is indium tin oxide conductive glass.

Specifically, the pixel defining layer 119 is an inorganic material, and the blocking pattern 122 is an organic material.

Preferably, the material of the inorganic material protection layer 116 and the pixel defining layer 119 may be silicon oxide.

In the embodiment, the organic light emitting display panel comprises a substrate, a plurality of anode electrodes, a pixel defining layer, a blocking pattern, an organic light emitting layer, and a cathode layer, wherein the blocking pattern separates the organic light emitting layer and the cathode layer in the effective light emitting area, and the organic light emitting layer and the cathode layer in the none-effective light emitting area, it is possible to suppress the lateral conduction path of the organic light emitting layer, thereby display quality of the panel can be improved.

The present invention further provides a display device, which comprises an organic light emitting display panel in the above-mentioned embodiment. Because the lateral conduction path of the organic light emitting layer is suppressed, so display quality of the panel can be improved, thereby the performance of the display device can be improved.

Wherein, the structure of the organic light emitting display panel is the same as the above-mentioned embodiment, therefore no additional description is given herebelow. In addition, the structure of other parts of the display device may be referred to the prior art, therefore no additional description is given herebelow. The display device may be a product or a component having any display function such as a smartphone, a tablet, a television, or the like.

In the present embodiment, the organic light emitting display panel comprises a substrate, a plurality of anode electrodes, a pixel defining layer, a blocking pattern, an organic light emitting layer, and a cathode layer, wherein the blocking pattern separates the organic light emitting layer and the cathode layer in the effective light emitting area, and the organic light emitting layer and the cathode layer in the none-effective light emitting area, it is possible to suppress the lateral conduction path of the organic light emitting layer, thereby display quality of the panel can be improved.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. An organic light emitting display panel, wherein comprises:
    a substrate;
    a plurality of anode electrodes arranged on the substrate in an array manner;
    a pixel defining layer arranged on the substrate and at least exposing partially the anode electrode, thereby an effective light emitting area corresponding to each of the anode electrode and a non-effective light emitting area located around the effective light emitting area being defined;

a blocking pattern arranged on the pixel defining layer and at least surrounding partially the effective light emitting area;

an organic light emitting layer arranged on the anode electrode, the blocking pattern, and the pixel defining layer;

a cathode layer arranged on the organic light emitting layer, wherein the blocking pattern separates the organic light emitting layer and the cathode layer in the effective light emitting area, and the organic light emitting layer and the cathode layer in the none-effective light emitting area.

2. The organic light emitting display panel as recited in claim 1, wherein the blocking pattern is arranged such that the organic light emitting layer and the cathode layer in the effective light emitting area and the organic light emitting layer and the cathode layer on the blocking pattern are separated from each other, and the organic light emitting layer and the cathode layer on the blocking pattern and the organic light emitting layer and the cathode layer in the non-effective light emitting area are separated from each other.

3. The organic light emitting display panel as recited in claim 1, wherein the cross-section of the blocking pattern perpendicular to the substrate is arranged in an inverted trapezoidal shape, the length of upper base of the trapezoidal shape far to the substrate is larger than the length of lower base of the trapezoidal shape near to the substrate, and the angle between the lower base and leg of inverted trapezoidal shape is an obtuse angle.

4. The organic light emitting display panel as recited in claim 1, the organic light emitting display panel further comprises scanning lines and data lines arranged on the substrate, and the organic light emitting layer and the cathode layer in the non-effective light emitting area at least overlaps partially the scanning line or the data line.

5. The organic light emitting display panel as recited in claim 1, wherein the pixel defining layer covers the edge of the anode electrode, and the blocking pattern is at least arranged partially on the area that the pixel defining layer covers the anode electrode.

6. The organic light emitting display panel as recited in claim 1, wherein the organic light emitting display panel further comprises a driving circuit arranged on the substrate, and the blocking pattern is further arranged on the driving circuit.

7. The organic light emitting display panel as recited in claim 1, wherein which is characterized in that the angle is not less than 120 degrees and not more than 150 degrees.

8. The organic light emitting display panel as recited in claim 1, wherein the pixel defining layer is an inorganic material, and the blocking pattern is an organic material.

9. The organic light emitting display panel as recited in claim 1, wherein the organic light emitting layer and the cathode layer are arranged wholly on the substrate.

10. The organic light emitting display panel as recited in claim 1, wherein the blocking pattern surrounds the effective light emitting area and an opening area is arranged, and the organic light emitting layer and the cathode layer in the effective light emitting area are electrically connected to the organic light emitting layer and the cathode layer in the non-effective light emitting area via the opening area.

11. The organic light emitting display panel as recited in claim 10, wherein the effective light emitting area is arranged in a rectangular shape, the blocking pattern surrounds three of the four sides of the effective light emitting area, and the opening area is arranged on the rest side of the effective light emitting area.

12. A display device, which comprises:

a substrate;

a plurality of anode electrodes arranged on the substrate in an array manner;

a pixel defining layer arranged on the substrate and at least exposing partially the anode electrode, thereby an effective light emitting area corresponding to each of the anode electrode and a non-effective light emitting area located around the effective light emitting area being defined;

a blocking pattern arranged on the pixel defining layer and at least surrounding partially the effective light emitting area;

an organic light emitting layer arranged on the anode electrode, the blocking pattern, and the pixel defining layer;

a cathode layer arranged on the organic light emitting layer, wherein the blocking pattern separates the organic light emitting layer and the cathode layer in the effective light emitting area, and the organic light emitting layer and the cathode layer in the none-effective light emitting area;

a driving circuit arranged on the substrate.

13. An organic light emitting display panel, wherein comprises:

a substrate;

a plurality of anode electrodes arranged on the substrate in an array manner;

a pixel defining layer arranged on the substrate and at least exposing partially the anode electrode, thereby an effective light emitting area corresponding to each of the anode electrode and a non-effective light emitting area located around the effective light emitting area being defined;

a blocking pattern arranged on the pixel defining layer and at least surrounding partially the effective light emitting area, wherein the cross-section of the blocking pattern perpendicular to the substrate is arranged in an inverted trapezoidal shape, the length of upper base of the trapezoidal shape far to the substrate is larger than the length of lower base of the trapezoidal shape near to the substrate, and the angle between the lower base and leg of inverted trapezoidal shape is an obtuse angle;

an organic light emitting layer arranged on the anode electrode, the blocking pattern, and the pixel defining layer;

a cathode layer arranged on the organic light emitting layer, wherein the blocking pattern separates the organic light emitting layer and the cathode layer in the effective light emitting area, and the organic light emitting layer and the cathode layer in the none-effective light emitting area, and wherein the organic light emitting layer and the cathode layer are arranged wholly on the substrate.

14. The organic light emitting display panel as recited in claim 13, wherein the blocking pattern is arranged such that the organic light emitting layer and the cathode layer in the effective light emitting area and the organic light emitting layer and the cathode layer on the blocking pattern are separated from each other, and the organic light emitting layer and the cathode layer on the blocking pattern and the organic light emitting layer and the cathode layer in the non-effective light emitting area are separated from each other.

15. The organic light emitting display panel as recited in claim 13, wherein the blocking pattern surrounds the effective light emitting area and an opening area is arranged, and the organic light emitting layer and the cathode layer in the effective light emitting area are electrically connected to the organic light emitting layer and the cathode layer in the non-effective light emitting area via the opening area.

16. The organic light emitting display panel as recited in claim 15, wherein the effective light emitting area is arranged in a rectangular shape, the blocking pattern surrounds three of the four sides of the effective light emitting area, and the opening area is arranged on the rest side of the effective light emitting area.

17. The organic light emitting display panel as recited in claim 13, the organic light emitting display panel further comprises scanning lines and data lines arranged on the substrate, and the organic light emitting layer and the cathode layer in the non-effective light emitting area at least overlaps partially the scanning line or the data line.

18. The organic light emitting display panel as recited in claim 13, wherein the pixel defining layer covers the edge of the anode electrode, and the blocking pattern is at least arranged partially on the area that the pixel defining layer covers the anode electrode.

19. The organic light emitting display panel as recited in claim 13, wherein the organic light emitting display panel further comprises a driving circuit arranged on the substrate, and the blocking pattern is further arranged on the driving circuit.

20. The organic light emitting display panel as recited in claim 13, wherein the angle is not less than 120 degrees and not more than 150 degrees.

* * * * *